United States Patent
Rommeveaux

(10) Patent No.: US 7,407,825 B2
(45) Date of Patent: Aug. 5, 2008

(54) OPTICAL MICROSYSTEM AND METHOD FOR MAKING SAME

(75) Inventor: Philippe Rommeveaux, Coublevie (FR)

(73) Assignee: E2V Semiconductors (FR)

( * ) Notice: Subject to any disclaimer, the term of this patent is extended or adjusted under 35 U.S.C. 154(b) by 250 days.

(21) Appl. No.: 10/523,808

(22) PCT Filed: Sep. 2, 2003

(86) PCT No.: PCT/FR03/02629
§ 371 (c)(1),
(2), (4) Date: Feb. 8, 2005

(87) PCT Pub. No.: WO2004/023166
PCT Pub. Date: Mar. 18, 2004

(65) Prior Publication Data
US 2005/0287690 A1    Dec. 29, 2005

(30) Foreign Application Priority Data
Sep. 3, 2002    (FR) .................................. 02 10899

(51) Int. Cl.
*H01L 21/00* (2006.01)
(52) U.S. Cl. .................. 438/30; 438/113; 257/E21.499
(58) Field of Classification Search .................... 438/29, 438/30, 33, 106, 107, 110, 113; 257/444, 257/710; 349/151
See application file for complete search history.

(56) References Cited

U.S. PATENT DOCUMENTS

| | | | |
|---|---|---|---|
| 4,050,786 A * | 9/1977 | Feldman ..................... 349/155 |
| 4,956,687 A | 9/1990 | de Bruin et al. |
| 6,051,867 A | 4/2000 | Theil et al. |
| 6,091,194 A * | 7/2000 | Swirbel et al. ............... 313/498 |
| 6,396,118 B1 * | 5/2002 | Theil et al. .................... 257/444 |
| 6,822,324 B2 * | 11/2004 | Tao et al. ...................... 257/710 |
| 2003/0214618 A1* | 11/2003 | Tao et al. ...................... 349/151 |
| 2005/0104204 A1* | 5/2005 | Kawakubo et al. .......... 257/724 |
| 2007/0004087 A1* | 1/2007 | Kao et al. ..................... 438/113 |

FOREIGN PATENT DOCUMENTS

| | | |
|---|---|---|
| EP | 1 102 321 A | 5/2001 |
| EP | 1 122 790 A | 8/2001 |
| FR | 2 829 292 A | 3/2003 |
| JP | 61 255063 A | 11/1986 |

* cited by examiner

*Primary Examiner*—Michael S. Lebentritt
*Assistant Examiner*—Reema Patel
(74) *Attorney, Agent, or Firm*—Lowe Hauptman Ham & Berner, LLP

(57) ABSTRACT

The invention relates to the fabrication of optical microsystems for miniature cameras or miniature matrix displays. It is proposed that N dot matrix arrays and associated circuits should be collectively fabricated, on the front of a semiconductor wafer, to produce N identical chips, with on the side of each array, external connection lands; a plate, used to collectively form N identical optical image-forming structures, each optical image-forming structure covering a respective chip and being designed to form an overall image corresponding with the whole of the matrix array of the respective chip, is fabricated collectively and placed in close contact with the front of the semiconductor wafer; through the thickness of the wafer, conductive vias extending to the contact lands are opened, and, only after these various operations, the wafer is divided into N individual optical microsystems comprising an electronic chip covered by an optical structure.

4 Claims, 3 Drawing Sheets

OPTICAL MICROSYSTEM AND METHOD FOR MAKING SAME

CROSS-REFERENCE TO RELATED APPLICATIONS

The present Application is based on International Application No. PCT/FR03/02629, filed on Sep. 2, 2003, which in turn corresponds to FR 02/10899 filed on Sep. 3, 2002, and priority is hereby claimed under 35 USC §119 based on these applications. Each of these applications are hereby incorporated by reference in their entirely into the present application.

FIELD OF THE INVENTION

The invention relates to optical microsystems with monolithic electronic dot matrix.

BACKGROUND OF THE INVENTION

The term "optical microsystems" is used here to mean image sensing or image display systems formed from a monolithic chip (in principle, made of silicon) on which has been etched on the one hand a dot matrix array in rows and columns and on the other hand electronic circuits controlling this matrix array; an optical image-forming structure is placed in close contact with the silicon chip, the chip and attached optical structure together forming the optical microsystem.

In the case of an image sensor, the matrix arrayed dots are photosensitive elements generating electrical signals according to the light received by the cell; the optical image-forming structure is then a system (objective lens, in principle) capable of projecting an overall image to be detected onto the matrix array of photosensitive cells formed on the monolithic chip.

Conversely, in the case of an image display device, the dots are electrooptical cells emitting, or transmitting, or reflecting light, modulating it according to an electrical signal applied to the cell; the optical image-forming structure is then a structure capable of transforming the electrical signals applied to the matrix array of electrooptical cells formed on the chip into a visible image, real or virtual.

These optical Microsystems are intended for applications in which miniaturization is essential. Examples of these include miniature optical modulators designed to project video signals, viewfinders of photographic equipment or cameras, display screens and miniature cameras on mobile phone handsets, etc.

The cost of these systems is largely due to the cost of fabrication of the integrated circuit chip. This cost in turn results on the one hand from the area of silicon used to fabricate a chip, and on the other hand from the nature and number of operations involved in fabrication. In particular, the cost is the result of the collective or noncollective nature of the operations, in the sense that certain operations are carried out collectively on a silicon wafer comprising a certain number of individual chips, whereas other operations must be carried out individually on each chip after cutting the wafer into individual chips. If certain operations cannot be carried out collectively, the cost is increased. For the collective operations, if the area of silicon used is larger for a chip, only a smaller number of chips can be placed on a wafer, so increasing the cost of the operations for each chip.

The addition to the electronic chip of an optical structure raises similar cost problems since, on the one hand, additional operations are necessarily required to produce this structure and, on the other hand, the need to add an optical system to the chip can modify and make more complex or more costly the operations required for the electronic chip itself.

One object of the invention is therefore to improve the ratio between the performance and the cost of fabrication of an optical microsystem.

SUMMARY OF THE INVENTION

The invention proposes a fabrication process for an optical microsystem with monolithic electronic matrix, in which N dot matrix arrays and circuits associated with each array are fabricated collectively, on the front of a semiconductor wafer (in principle, made of silicon) of a thickness of at least around one hundred or several hundred microns, in order to produce on this wafer N identical monolithic electronic chips, with, on at least one side of each array, a set of electrical contact lands for connecting the corresponding chip externally, a plate for collectively forming N identical image formation optical structures is fabricated collectively and placed in close contact with the front of the semiconductor wafer, each image formation optical structure covering a respective chip and being designed to form an overall image corresponding with the whole of the matrix array of the respective chip, holes through to the contact lands on the front are opened at the back of the semiconductor wafer and through its thickness, these holes are used to establish a conductive electrical connection with the contact lands from the back of the wafer, and, only after these various operations, the wafer is divided into N individual optical Microsystems, the separation between the chips and the separation between the optical structures covering the chips being carried out along the same cutting lines.

The optical microsystem according to the invention therefore comprises the close association of a monolithic electronic chip of a thickness of around one hundred or several hundred microns, bearing on its front a dot matrix array and electrical contact lands, and an optical structure for forming an overall image corresponding to the array, the structure being placed against the front of the chip, with electrical contacts at the back of the chip and conductive vias between these electrical contacts on the back and the contact lands on the front, for access to the matrix array.

In the case of an image microdisplay using as associated optical structure a cavity filled with liquid crystal and sealed with a plate comprising a back electrode, the liquid crystal being situated between the chip and this plate, provision may also be made for the chip to include a hole for filling the cavity from the back of the chip, extending from the back to the front of the chip, this hole being sealed with a plug. This hole is formed like the electrical access holes that pass through the thickness of the chip and provide electrical access to the matrix array from the back of the chip.

The holes are formed in practice by anisotropic plasma etching, this technique being used to form in the silicon holes of a few tens of microns in diameter or side, over several hundred microns in depth. Laser or ultrasonic drilling techniques may also be considered.

Preferably, the fabrication process includes a step for bonding the chip to the optical image-forming structure; this step can include the formation of a sealing bead around each chip to provide for this bonding; this bead is deposited in rows and columns, at the collective fabrication stage, on the semiconductor wafer or on the plate intended to form the optical structures; at the end of the collective fabrication steps, the wafer and the plate are cut along rows and columns extending in the direction of the sealing beads and preferably centered widthwise along the latter.

BRIEF DESCRIPTION OF THE DRAWINGS

Other features and benefits of the invention will become apparent on reading the detailed description that follows, given with reference to the appended drawings in which.

The invention will be described mainly with respect to a liquid crystal image microdisplay for which it is particularly interesting.

Figure 1:
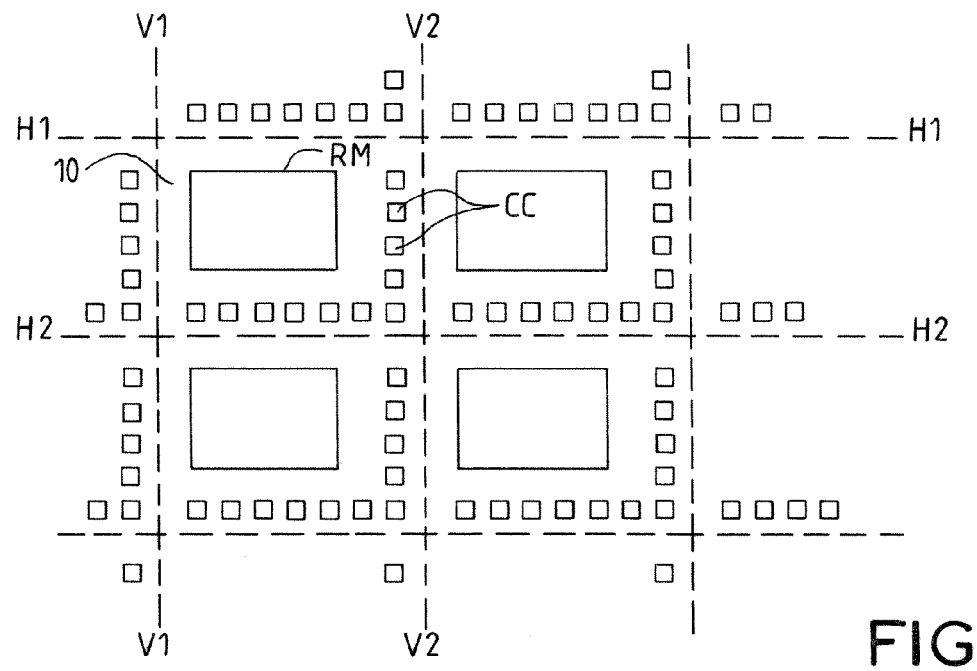
FIG. 1 and FIG. 2 represent, in plan view, the principle of offset superposition of an electronic chip array and an optical structure array in a collective fabrication.

For a better understanding of the problems raised by the collective fabrication of an optical microsystem, and in the present case a liquid crystal microdisplay, FIG. 1 diagrammatically represents, in plan view, a silicon wafer (or more generally, an integrated circuit substrate) on the front of which have been fabricated collectively N identical integrated circuits, each corresponding to one of the microdisplays to be produced. After the collective fabrication operations, performed on the wafer, the latter is intended to be separated into individual chips along straight lines shown dashed in FIG. 1. An individual monolithic chip is delimited by a network of two adjacent horizontal dashed lines H1H1 and H2H2 and two adjacent vertical dashed lines V1V1 and V2V2.

An individual chip 10 comprises a dot matrix array RM, peripheral circuits around this network, and metal contact lands CC on the periphery of the chip along at least one side of the chip, but in practice along two sides when there are a large number of contacts to be placed (several tens, for example).

In a conventional manner, in the fabrication of an integrated circuit chip, the electrical contact lands CC are intended to be connected externally via wires soldered to these lands (a technique called "wire-bonding").

To form from this chip an optical microsystem comprising both a chip and an optical image-forming structure, it is desirable, as far as possible, to fabricate collectively the optical structure from a wafer incorporating N structures in the same way as the chip is collectively fabricated from a silicon wafer comprising N chips.

This fabrication, however, comes up against obstacles, the consequences of which the present invention seeks to minimize.

A particular obstacle is due to the need to leave the access to the electrical contact lands CC free to allow wires to be bonded to them.

Figure 2:
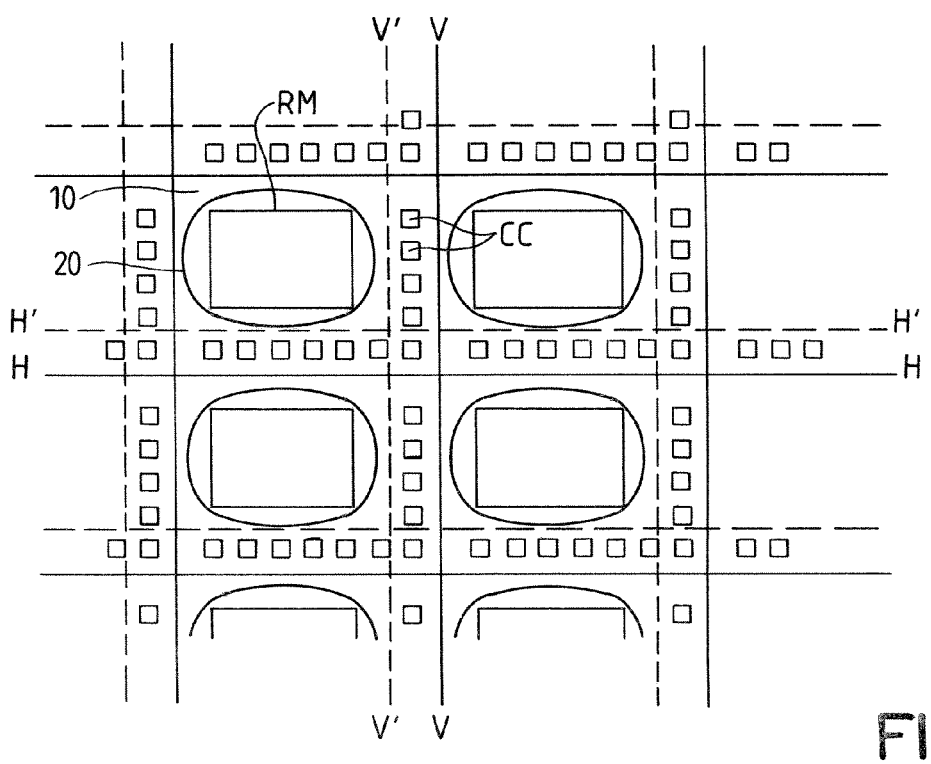

In FIG. 2, it is assumed that the optical structure is fabricated collectively on a specific wafer that is added (by bonding, welding or other means) to the silicon wafer. An individual optical structure 20, corresponding to a chip 10, has been marked symbolically in the form of an oval situated above the matrix array 20. For a liquid crystal microdisplay, the optical image-forming structure 20 mainly comprises a cavity filled with liquid crystal and a transparent electrode deposited on a glass plate, used to convert directly the electrical signals from the matrix array into an overall image to be displayed. In the case of an image sensor, the structure would be formed, for example, by a lens projecting the complete image to be detected onto the matrix array.

For the electrical contact lands CC to remain clear for subsequent bonding of connecting wires after cutting into individual microsystems, it will be understood that the wafer must be cut into optical structures according to a network of horizontal and vertical lines that are not identical to the chip cutting lines: if the chip 10 is cut on the right along a vertical line VV and at the bottom along a horizontal line HH, the corresponding optical structure must be cut on the right along a line V'V' offset from the line VV and at the bottom along a line H'H' offset from the line HH. The contact lands are situated on the one hand between the lines HH and H'H' and on the other hand between the lines VV and V'V'. The network of rows and columns for cutting the optical structures is a network offset from the network of chip cutting rows and columns.

The collective fabrication of the microsystem by the integration of a wafer of optical structures on the silicon wafer before these wafers are cut into N individual Microsystems is therefore made difficult and costly because of this two-stage cutting operation: cutting on the top side, cutting on the bottom side, according to two different networks of rows and columns.

Figure 3:
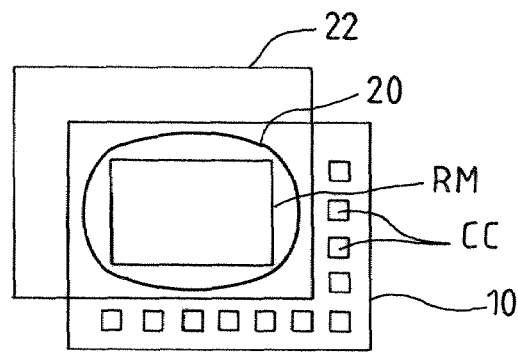
FIG. 3 and FIG. 4 represent, respectively in plan and side cross-sectional views, an individual optical microsystem resulting from wafer cutting after collective fabrication.

FIG. 3 shows an optical microsystem resulting from this double cutting method, showing the offset superposition between the optical wafer 22 obtained from cutting the wafer of optical structures and the chip 10 obtained from cutting the silicon wafer, the contacts CC of the chip not being covered by the optical wafer 22.

Figure 4:
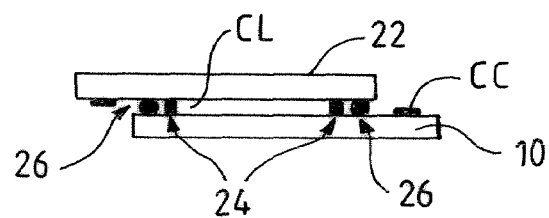

FIG. 4 represents a side view of the microsystem, also showing this offset between the lateral edges of the chip and the lateral edges of the optical wafer 22. This FIG. 4, corresponding to the case of a liquid crystal display, shows a cavity filled with liquid crystal CL, this cavity being formed between the front of the silicon chip 10 (the front being the side on which the matrix array has been formed) and the wafer 22. The cavity covers all of the matrix array RM. Spacers 24 can be provided to define the thickness of the cavity. A sealing bead 26 (in principle made of epoxy resin) surrounds the entire cavity to hermetically seal it while bonding the silicon wafer onto the wafer of optical structures level with each chip.

Figure 5:
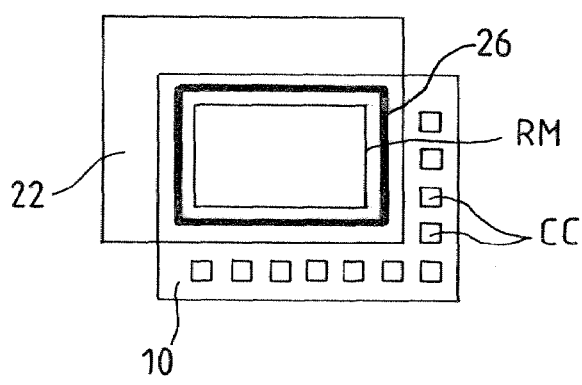
FIG. 5 represents the margins to be complied with to establish the offset between the chips and the optical systems on cutting the wafers.

FIG. 5 represents, in plan view, the position of the sealing bead 26 around the cavity which overhangs the matrix array RM. It can be seen that the practical fabrication of such a system requires the provision of:

a spacing margin between the matrix array RM and the weld bead 26;

a spacing margin between the weld bead 26 and the edge of the optical wafer 22;

a spacing margin between the edge of the optical wafer and the contact lands CC; this large value margin is necessary in particular for the toolage for bonding wires onto the contact lands CC;

a spacing margin between the contact lands CC and the edge of the silicon wafer.

These margins correspondingly increase the chip area needed for a matrix array RM of a given dimension and correspondingly increase the cost of the microsystem of given performance.

Figure 6:
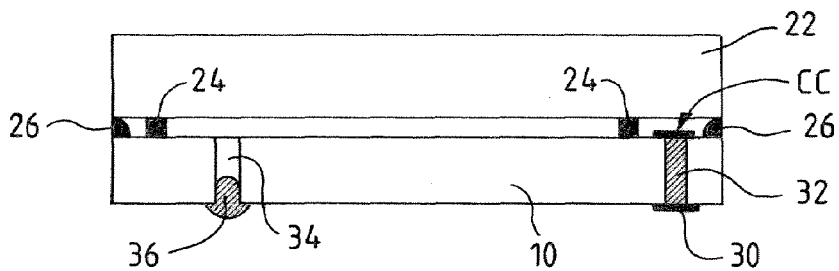
FIG. 6 represents an optical microsystem structure according to the invention.

FIG. 6 gives a cross-sectional representation of the theoretical structure of the microsystem according to the invention.

The silicon chip 10 and the optical wafer 22 are precisely superposed with no lateral offset. The contact lands CC on the front of the chip are electrically linked to respective contact lands 30 on the back of the chip by respective conductive vias 32 passing right through the thickness of the chip, this thickness being conventionally a few hundred microns, and in any case at least 70 microns. The thickness stated here is given by comparison with image sensors formed on thinned silicon with a thickness of around 10 microns or less, which involve delicate operations, in particular transfer onto a supporting substrate and lapping, and which are not the concern of the present invention, whether for image sensors or, a fortiori, for displays.

In the example represented, which is a liquid crystal display, the cavity filled with liquid crystal CL is closed at the top by a wafer 22 which is preferably a glass wafer, and at the sides by a sealing bead 26 which completely surrounds and precisely follows the periphery of the chip and of the wafer with no spacing margin between the bead 26 and the edge of the wafer (or of the chip) or, if necessary, with a very small margin. Spacers 24 can be provided to define the spacing between the chip and the optical wafer 22 (these spacers could be embedded in the sealing bead).

The optical image-forming structure is formed by the wafer 22 and the cavity of which it forms a main wall.

The spacing margins that were necessary in the embodiment represented in FIG. 5 are no longer necessary. A proportionally much larger area of chip can be assigned to the matrix array.

The contact lands CC can be distributed, if so desired or if necessary, around the four sides of the chip, which would not have been possible with a configuration such as that of FIG. 5 with offset between chip and optical wafer.

Very advantageously, for a liquid crystal display a liquid crystal filling hole 34 through the thickness of the silicon chip is also provided. The hole is made either at the same time as the contact via holes 32, or later. This hole 34 is plugged, after the cavity has been filled with liquid crystal, by a plug 36 of adhesive, for example UV-curable adhesive. Filling and plugging take place during fabrication on the wafer, before division of the wafer into individual microsystems, which is particularly advantageous especially from the point of view of the purity of the liquid crystal introduced (minimizing impurities when working on wafers). Filling is done after having placed the wafer of microsystems in a vacuum for several hours.

With this filling hole, there is no need for the sealing bead 26 to be interrupted over a part of its periphery, to allow filling before closing the interrupted part of the sealing bead.

The holes in thick silicon, for the contact vias or for the filling orifice, can be made by plasma reactive ion etching. Holes with a diameter or width or a few tens of microns can be made to a depth of several hundred microns, and that is very suitable. The contact lands CC have a width slightly greater than the width of the hole, so that the hole emerges with certainty at the back of the contact pad. The filling hole can have a larger diameter than the electrical connection vias if the characteristics of the liquid crystal demand it; it does not emerge on a contact land.

On the back of the chip, a conductive layer can be deposited and etched forming contacts 30 linked to the conductive vias 32. This layer can moreover be used to create a network of interconnections on the back of the chip. The contacts 30 can be used conventionally for connections external to the chip, either by soldered wires, or by direct bonding onto a substrate having contact lands in line with the contacts 30 and soldering between the chip and the substrate. In this latter case, it is desirable to form the contacts 30 as conductive bumps located on these contacts, or to form such bumps at other required locations on the back of the chip and then link these bumps to the contacts 30 via interconnections formed at the same time as the contacts 30.

Figure 7:
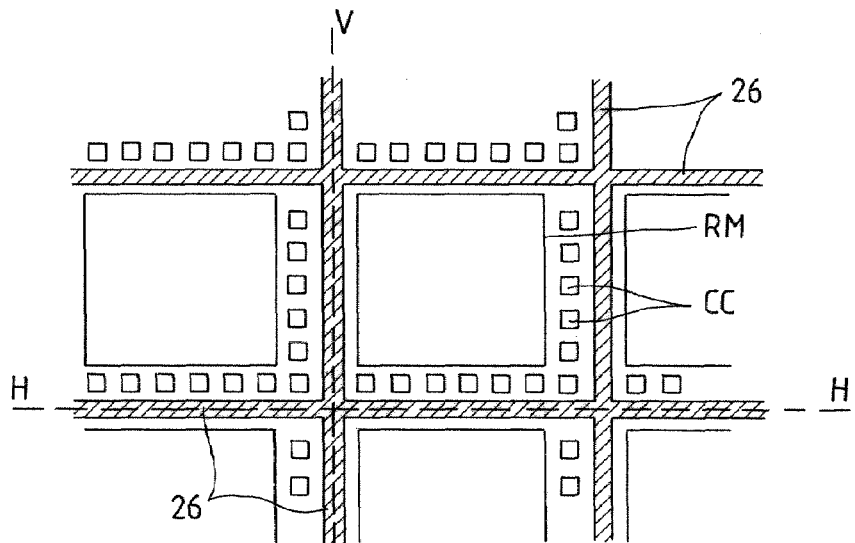
FIG. 7 represents the configuration of sealing beads between chips and optical systems and the cutting lines centered widthwise along the beads.

The chips and the optical wafers can be cut in a single cutting operation, with no lateral offset and with no need to make a cut underneath and then on top of the wafer. Furthermore, given that the sealing bead 26 does not need to be located between the matrix array and the contact lands CC, it is possible to provide a single sealing bead line between two adjacent rows of chips on the wafer, and the sawing into individual microsystems after the end of the wafer fabrication process can be done along the center of a single sealing bead placed precisely between the two rows of chips. FIG. 7 represents the theoretical general arrangement showing the sealing beads 26, of which the center lines HH and VV constitute the microsystem cutting lines. The sealing bead can have a total width of approximately 250 microns.

It will be noted that, in a liquid crystal display application, the optical structure comprises a matrix array of electrodes on the chip and a back electrode on the optical wafer 22, the liquid crystal being controlled by a potential difference between an electrode of the matrix array and the back electrode formed on the wafer 22. In FIG. 4, a contact land could be provided under the wafer to provide electrical access to the back electrode, this contact land being accessible given that it is located in the part of the optical wafer not covering the chip 10.

Figure 8:
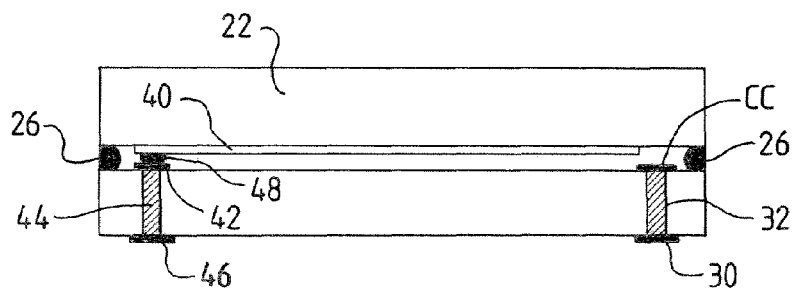
FIG. 8 shows how to produce an electrical port with a back electrode formed on the optical structure.

In the structure according to the invention, an electrical connection is established with the back electrode 40, similar to those established with the bonding pads of the chip, and this in the manner represented in FIG. 8. This figure shows, for simplicity, on the right, one of the contact lands CC on the chip with a via 32 through the thickness of the chip, this via 32 meeting a conductive land 30 on the back of the chip, and on the left, another contact land 42 on the front of the chip, covering a conductive via 44 passing right through the thickness of the chip and meeting a conductive land 46 on the back of the chip. The via 44 is, like the via 32, filled with conductive material. Above the contact land 42, a drop of conductive adhesive 48 for example is deposited, which makes contact with the back electrode 40 of the wafer 22. This deposit is made before adhesively bonding the two wafers to each other. In this way, an electrical access to the back electrode through the back of the chip is established.

Overall, the microsystem fabrication process can be summarized as follows:

The silicon wafer is treated in the conventional way by deposition, etching, doping operations, preferably in CMOS technology, in order to create the matrix array RM, the circuits controlling this array, other ancillary circuits (converters, signal processing circuits, etc), and the contact lands CC.

The holes intended to form the conductive vias 32 are made by reactive ion etching, through the back of the silicon wafer, the holes to be etched being delimited by a photoetched resin according to the pattern of holes to be formed. For this photoetching, a resist alignment is carried out preferably using a system of infrared lighting passing through the thickness of the silicon chip and used to check that the position of the photoetch resist on the back of the semiconductor wafer is correct relative to the position of the contact lands 44 on the front of the wafer. The holes can also be made by laser or ultrasonic micromachining.

Etching of the silicon is stopped when the etchants reach the contact lands CC, demonstrating that the holes have passed right through the thickness of the silicon. The stopping of etching is either automatic if the etchant does not attack the aluminum of the contact lands, or detected on the appearance of aluminum particles. Etching can also be stopped, in CMOS technology, at a layer of silicon oxide produced prior to metal deposition.

The filling hole 34 can be made at this stage or can be made separately.

The holes are surface-oxidized to prevent subsequent electrical contact between the conductive vias and the silicon substrate forming the body of the chip.

Then a metal (preferably aluminum) is deposited in the holes. The filling hole 34 is protected at this stage if it has already been formed. The metal deposited in the holes is over their surface or else it fills the holes.

A metal layer is deposited over the entire back surface either simultaneously with the preceding metal deposition or in a separate operation. This layer is etched to form the contacts 30 and any interconnections on the back of the chip.

The filling hole 34 can be made at this stage, if it has not already been made.

Conductive bumps can, if necessary, be made at this stage on the back of the chip if the microsystem needs to be bonded by direct, pad-to-pad surface soldering on a support substrate. The bumps are in principle made by electrolytic deposition on conductive lands on the back of the chip.

To produce the contacts through the substrate, different methods can be considered, including, for example, the delimitation of conductive silicon pads passing right through the thickness of the substrate and surrounded by a cylindrical ring of insulator.

At this stage, the operations on the back of the chip are finished.

Spacers have been formed on the front of the wafer of the chip or are formed at this stage (spacers made of resin or oxide, of controlled thickness) at locations that do not interfere with the optical operation.

A layer of liquid-crystal-keying polyimide can be deposited at this stage, in particular when the liquid crystal needs to be oriented according to a rubbing direction of the layer with which it is in contact (as in the case of twisted nematic liquid crystals in particular). The polyimide is rubbed in the desired direction.

An adhesive sealing bead (epoxy resin) is deposited in rows and columns between the chips of the wafer.

A drop of conductive adhesive or a ball of conductive material of a diameter greater than the thickness of the finished cavity is deposited above that of the contact lands CC to provide contact with a back electrode of the optical structure.

The wafer of optical structures is, in practice, a single wafer of glass coated with an overall back electrode, delimited or not delimited for each chip, this back electrode itself being coated with rubbed polyimide if the nature of the liquid crystal requires it. The wafer of optical structures is adhesively bonded to the silicon wafer. The sealing bead seals each cavity and bonds the wafers to each other. Contact with the back electrode is established by the conductive adhesive.

The sealing bead is thermally cured.

The cavity can then be filled with liquid crystal, after having created a vacuum in the cavity. The vacuum is created by pumping and baking for several hours.

The filling hole is sealed by a plug of adhesive, for example an UV-cured adhesive.

The wafer can then be cut into individual Microsystems, for example by sawing along the rows and columns, following the widthwise center line of the sealing beads.

The microsystems can be surface mounted, if necessary, onto a substrate, by conventional surface mounting techniques (soldered wires, the chip then being flipped over so that the front faces the substrate, but it is then necessary for the substrate to be open opposite the chip, failing which the optical structure would not be able to function), or surface mounting by soldering, pad to pad, when conductive bumps have been made on the back of the chip.

The invention is particularly interesting in respect of liquid crystal microdisplays, in which the electrodes of the matrix array are used both as control electrodes for locally applying a potential difference to the liquid crystal, and as an optical mirror to reflect the light reaching the electrode through the liquid crystal and return it back through the liquid crystal. The electrodes are in this case preferably made of aluminum.

The invention claimed is:

1. A fabrication process for an optical microsystem with a monolithic electronic matrix; comprising the steps of:
   fabricating collectively N dot matrix arrays and circuits associated with each array, on the front of a semiconductor wafer of a thickness of at least around one hundred or several hundred microns;
   producing on this wafer N identical monolithic electronic chips, with, on at least one side of each array, a set of electrical contact lands for connecting the corresponding chip externally;
   fabricating collectively a plate for forming N identical optical image forming structures placed in close contact with the front of the semiconductor wafer, each optical image-forming structure covering a respective chip and being designed to form an overall image corresponding with the whole of the matrix array of the respective chip,
   opening holes at the back and through to the contact lands on the front of the semiconductor wafer and through its thickness, these holes are used to establish a conductive electrical connection with the contact lands from the back of the wafer, and, dividing the wafer into N individual optical microsystems, the separation between the chips and the separation between the optical structures covering the chips being carried out along the same cutting lines.

2. The process as claimed in claim 1, comprising:
   forming a sealing bead around each chip for bonding the chip with the optical image-forming structure,
   depositing the bead in rows and columns at the collective fabrication stage, on the semiconductor wafer or on the plate intended to form the optical structures,
   wherein at the end of the collective fabrication steps on the wafer, the wafer and the plate are cut along rows and columns extending in the direction of the sealing beads, centered widthwise along the latter.

3. The process as claimed in claim 1, intended for the fabrication of a liquid crystal microdisplay, a liquid crystal being contained in a cavity formed between the chip and the plate intended to form the optical structures, further comprising:
   a filling hole is made, for each chip, through the thickness of the semiconductor wafer, and in that the filling is carried out and a plug is formed in the hole after filling, before carrying out separation of the wafer and of the plate into individual microsystems.

4. The process as claimed in claim 2, intended for the fabrication of a liquid crystal microdisplay, a liquid crystal being contained in a cavity formed between the chip and the plate intended to form the optical structures, further comprising:
   a filling hole is made, for each chip, through the thickness of the semiconductor wafer, and in that the filling is carried out and a plug is formed in the hole after filling, before carrying out separation of the wafer and of the plate into individual microsystems.

* * * * *